(12) United States Patent
Takamine

(10) Patent No.: US 7,358,832 B2
(45) Date of Patent: *Apr. 15, 2008

(54) BALANCED SAW FILTER

(75) Inventor: Yuichi Takamine, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/733,068

(22) Filed: Apr. 9, 2007

(65) Prior Publication Data
US 2007/0182511 A1 Aug. 9, 2007

Related U.S. Application Data

(63) Continuation of application No. PCT/JP2005/018756, filed on Oct. 12, 2005.

(30) Foreign Application Priority Data
Nov. 4, 2004 (JP) ............... 2004-320551

(51) Int. Cl.
H03H 9/64 (2006.01)
(52) U.S. Cl. ....................... 333/193; 333/195
(58) Field of Classification Search ............... 333/193, 333/195
See application file for complete search history.

(56) References Cited

U.S. PATENT DOCUMENTS

| 5,717,367 A | 2/1998 | Murai |
| 5,790,000 A * | 8/1998 | Dai et al. .................... 333/193 |
| 5,994,980 A | 11/1999 | Tada |
| 6,268,782 B1 * | 7/2001 | Hartmann et al. .......... 333/193 |
| 6,583,691 B2 | 6/2003 | Takamine |
| 6,667,673 B1 | 12/2003 | Strauss |
| 6,759,928 B2 | 7/2004 | Endou et al. |
| 2004/0066115 A1 | 4/2004 | Takamine |
| 2004/0080385 A1 | 4/2004 | Takamine et al. |
| 2005/0212621 A1 * | 9/2005 | Takamine .................... 333/195 |

(Continued)

FOREIGN PATENT DOCUMENTS

EP 1249934 A2 10/2002

(Continued)

OTHER PUBLICATIONS

Official Communication for PCT Application No. PCT/JP2005/018756; mailed on Jan. 17, 2006.

(Continued)

Primary Examiner—Barbara Summons
(74) Attorney, Agent, or Firm—Keating & Bennett, LLP

(57) ABSTRACT

In a balanced SAW filter, a third IDT of a first SAW filter element includes first and second IDT segments, and similarly, an eighth IDT of a second SAW filter element includes first and second IDT segments. A first IDT, the first IDT segment, the second IDT segment, and a fifth IDT included in the first SAW filter element are respectively connected to a sixth IDT, the first IDT segment, the second IDT segment, and a tenth IDT segment included in the second SAW filter element by first to fourth wiring lines. The phase of electric signals transmitted through the first and third wiring lines differs from the phase of electric signals transmitted through the second and fourth wiring lines by 180°.

7 Claims, 2 Drawing Sheets

U.S. PATENT DOCUMENTS

2001/0171003 * 7/2007 Takamine .................. 333/195

FOREIGN PATENT DOCUMENTS

| JP | 07-176973 A | 7/1995 |
| JP | 08-265087 A | 10/1996 |
| JP | 10-117123 A | 5/1998 |
| JP | 11-097966 A | 4/1999 |
| JP | 2000-91883 A | 3/2000 |
| JP | 2002-009587 A | 1/2002 |
| JP | 2002-300004 A | 10/2002 |
| JP | 2003-507917 A | 2/2003 |
| JP | 2004-88551 A | 3/2004 |
| JP | 2004-96244 A | 3/2004 |
| WO | 02/03549 A1 | 1/2002 |

OTHER PUBLICATIONS

Official communication issued in the counterpart European Application No. 05793718.7, mailed on Nov. 5, 2007.

* cited by examiner

BALANCED SAW FILTER

BACKGROUND OF THE INVENTION

1. Field of the Invention

The present invention relates to balanced SAW filters having a balanced-unbalanced converting function. More specifically, the present invention relates to a balanced SAW filter having first and second 5-IDT-type longitudinally-coupled-resonator SAW filter elements arranged in two stages that are cascade-connected to each other.

2. Description of the Related Art

In mobile communication devices, such as portable telephones, surface acoustic wave (SAW) filters are widely used as bandpass filters. In particular, as portable telephones are being reduced in size and becoming increasingly sophisticated, a so-called balanced SAW filter having a balanced-unbalanced converting function has been used as an RF-stage band pass filter that is connected to an antenna terminal. An example of a balanced SAW filter of this type is disclosed in Japanese Unexamined Patent Application Publication No. 2000-91883 (Patent Document 1).

Referring to FIG. 3, a balanced SAW filter 100 disclosed in Patent Document 1 includes first and second longitudinally-coupled-resonator SAW filter elements 101 and 102 that are cascade-connected to each other. The first longitudinally-coupled-resonator SAW filter element 101 includes first to fifth IDTs 111 to 115 that are arranged in a propagation direction of surface acoustic waves. At the opposite ends of the region in which the IDTs 111 to 115 are arranged in the propagation direction of surface acoustic waves, reflectors 116 and 117 are provided.

Similarly, the second longitudinally-coupled-resonator SAW filter element 102 includes sixth to tenth IDTs 121 to 125 that are arranged in the propagation direction of surface acoustic waves, and also includes reflectors 126 and 127.

First ends of the second and fourth IDTs 112 and 114 are mutually connected to each other so as to be connected to an unbalanced terminal 131. First ends of the first, third, and fifth IDTs are mutually connected to each other. A second end of the first IDT 111 is connected to the sixth IDT 121 by a first wiring line 141. Similarly, the third and fifth IDTs 113 and 115 are respectively connected to the eighth and tenth IDTs 123 and 125 by second and third wiring lines 142 and 143. On the other hand, the first end of the seventh IDT 122 is connected to a first balanced terminal 132. A second end of the IDT 122 is mutually connected to a first end of the IDT 124. A second end of the IDT 124 is connected to a second balanced terminal 133. Due to the configuration described above, the SAW filter 100 according to Patent Document 1 has a reduced size and produces less insertion loss.

Although the 5-IDT-type longitudinally-coupled-resonator SAW filter elements 101 and 102 are cascade-connected to each other in the balanced SAW filter 100, signals of the same phase flow through the first to third wiring lines 141 to 143.

On the other hand, a wiring line 144 that electrically connects the second balanced terminal 133 to the ninth IDT 124 extends outward from between the second and third wiring lines 142 and 143 by crossing over a region in which the first and second wiring lines 141 and 142 are disposed, as shown in FIG. 3. Moreover, a wiring line 145 that connects the first balanced terminal 132 to the seventh IDT 122 is disposed in a region distant from the region where the first to third wiring lines 141 to 143 are disposed.

Consequently, direct waves caused by stray capacitance between the first to third wiring lines 141 to 143 and the first and second balanced terminals 132 and 133 are large, and these large direct waves are unfavorably applied to the balanced terminals 132 and 133. In addition, the magnitude of the direct wave applied to the balanced terminal 133 is significantly greater than the magnitude of the direct wave applied to the balanced terminal 132. This is problematic in that the degree of balance between the balanced terminals 132 and 133 is deteriorated.

SUMMARY OF THE INVENTION

To overcome the problems described above, preferred embodiments of the present invention provide a balanced SAW filter having first and second 5-IDT-type longitudinally-coupled-resonator SAW filter elements arranged in two stages that are cascade-connected to each other, which not only allows for a reduction in size and insertion loss but also reduces the effect of direct waves on two balanced terminals.

According to a preferred embodiment of the present invention, a balanced SAW filter includes a piezoelectric substrate, a first longitudinally-coupled-resonator SAW filter element including first to fifth IDTs arranged on the piezoelectric substrate in a propagation direction of surface acoustic waves, the second and fourth IDTs being connected to the unbalanced terminal, the third IDT in the center having a pair of bus bars, one of the bus bars being divided such that the third IDT includes first and second IDT segments, a second longitudinally-coupled-resonator SAW filter element including sixth to tenth IDTs arranged on the piezoelectric substrate in the propagation direction of surface acoustic waves, the seventh and ninth IDTs being respectively connected to the first and second balanced terminals, the eighth IDT in the center having a pair of bus bars, one of the bus bars being divided such that the eighth IDT includes first and second IDT segments, a first wiring line that connects the first IDT to the sixth IDT, a second wiring line that connects the first IDT segment of the third IDT to the first IDT segment of the eighth IDT, a third wiring line that connects the second IDT segment of the third IDT to the second IDT segment of the eighth IDT, and a fourth wiring line that connects the fifth IDT to the tenth IDT. The first to tenth IDTs are arranged such that the phase of electric signals transmitted through the first and third wiring lines differs from the phase of electric signals transmitted through the second and fourth wiring lines by 180°.

Preferably, the third IDT in the first longitudinally-coupled-resonator SAW filter element includes an end that is not connected to the second longitudinally-coupled-resonator SAW filter element, and the eighth IDT in the second longitudinally-coupled-resonator SAW filter element includes an end that is not connected to the first longitudinally-coupled-resonator SAW filter element, the end of the third IDT and the end of the eighth IDT being grounded.

Preferably, the third IDT in the first longitudinally-coupled-resonator SAW filter element includes an end that is not connected to the second longitudinally-coupled-resonator SAW filter element, and the eighth IDT in the second longitudinally-coupled-resonator SAW filter element includes an end that is not connected to the first longitudinally-coupled-resonator SAW filter element, the end of the third IDT and the end of the eighth IDT being electrically floating.

In the balanced SAW filter according to a preferred embodiment of the present invention, the first 5-IDT-type longitudinally-coupled-resonator SAW filter element and the second 5-IDT-type longitudinally-coupled-resonator SAW filter element are arranged in two stages and are cascade-connected to each other. In the balanced SAW filter, the third IDT in the center of the first longitudinally-coupled-resonator SAW filter element includes first and second IDT segments that are divided in the propagation direction of surface acoustic waves, and similarly, the eighth IDT in the center of the second longitudinally-coupled-resonator SAW filter element also includes first and second IDT segments that are divided in the propagation direction of surface acoustic waves. The phase of electric signals transmitted through the first wiring line that connects the first IDT to the sixth IDT and through the third wiring line that connects the second IDT segment of the third IDT to the second IDT segment of the eighth IDT differs by 180° from the phase of electric signals transmitted through the second wiring line that connects the first IDT segment of the third IDT to the first IDT segment of the eighth IDT and through the fourth wiring line that connects the fifth IDT to the tenth IDT.

Accordingly, the polar relationship among adjoining outermost electrode fingers of the IDTs connected to the first balanced terminal and the IDT adjoining these IDTs is the same as the polar relationship among adjoining outermost electrode fingers of the IDTs connected to the second balanced terminal and the IDT adjoining these IDTs, thereby achieving a high degree of balance between the first and second balanced terminals.

In preferred embodiments of the present invention, when an end of the third IDT in the first SAW filter element that is not connected to the second longitudinally-coupled-resonator SAW filter element and an end of the eighth IDT in the second longitudinally-coupled-resonator SAW filter element that is not connected to the first longitudinally-coupled-resonator SAW filter element are grounded, the grounding of the IDTs is enhanced, whereby insertion loss is reduced.

Alternatively, when an end of the third IDT in the first longitudinally-coupled-resonator SAW filter element that is not connected to the second longitudinally-coupled-resonator SAW filter element and an end of the eighth IDT in the second longitudinally-coupled-resonator SAW filter element that is not connected to the first longitudinally-coupled-resonator SAW filter element are electrically floating, it is not necessary to provide grounding pads at these ends of the third and eighth IDTs. Accordingly, this reduces the size of the piezoelectric substrate.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Exemplary preferred embodiments of the present invention will now be described with reference to the drawings.

Figure 1:
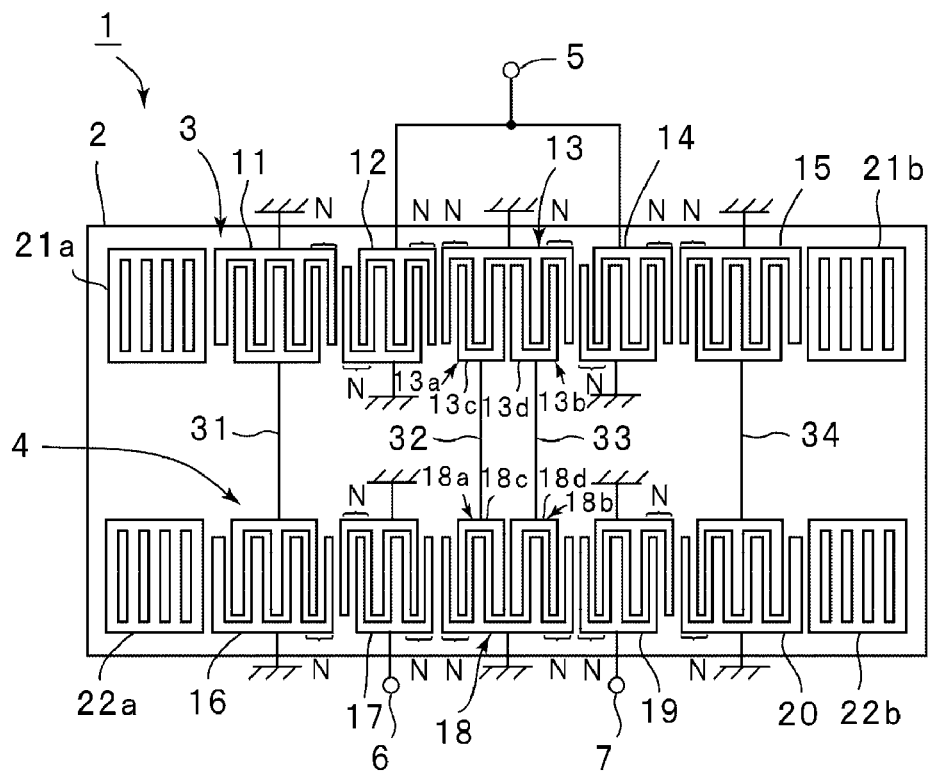
FIG. 1 is a schematic plan view of a balanced SAW filter according to a preferred embodiment of the present invention.

FIG. 1 is a schematic plan view of a balanced SAW filter according to a preferred embodiment of the present invention. A balanced SAW filter 1 according to this preferred embodiment is preferably used as an EGSM receiving band pass filter, for example. The pass band of the EGSM receiving band pass filter is between 925 MHz and 960 MHz.

The balanced SAW filter 1 includes a piezoelectric substrate 2. In this preferred embodiment, the piezoelectric substrate 2 is preferably a 40±5° Y-cut X-propagation LiTaO$_3$ substrate.

Alternatively, in preferred embodiments of the present invention, the piezoelectric substrate may be a piezoelectric single-crystal substrate of a different crystal angle or may be a piezoelectric ceramic substrate. Examples of piezoelectric single-crystal substrates include a 64° to 72° Y-cut X-propagation LiNbO$_3$ substrate and a 41° Y-cut X-propagation LiNbO$_3$ substrate.

The piezoelectric substrate 2 includes a plurality of electrodes disposed thereon which define a first longitudinally-coupled-resonator SAW filter element 3 and a second longitudinally-coupled-resonator SAW filter element 4. The first and second longitudinally-coupled-resonator SAW filter elements 3 and 4 are arranged in two stages that are cascade-connected to each other.

The first longitudinally-coupled-resonator SAW filter element 3 includes first to fifth IDTs 11 to 15 that are arranged on the piezoelectric substrate 2 in a propagation direction of surface acoustic waves. At the opposite ends of the region in which the IDTs 11 to 15 are disposed, reflectors 21a and 21b are provided.

First ends of the second IDT 12 and the fourth IDT 14 are mutually connected to each other so as to be connected to an unbalanced terminal 5. On the other hand, second ends of the IDTs 12 and 14 are connected to ground. First ends of the first and fifth IDTs 11 and 15 are connected to ground and second ends thereof are electrically connected respectively to a sixth IDT 16 and a tenth IDT 20 included in the second longitudinally-coupled-resonator SAW filter element 4.

The third IDT 13 in the center is divided into two segments arranged in the propagation direction of surface acoustic waves. More specifically, the third IDT 13 includes a first IDT segment 13a and a second IDT segment 13b that are arranged in the propagation direction of surface acoustic waves. Here, the IDT 13 includes a pair of bus bars, one of which being a common bus bar and the other being divided into the IDT segments 13a and 13b. In other words, this other bus bar is divided into two portions such that a section in which one bus bar portion 13c is disposed defines the first IDT segment 13a, and a section in which the other bus bar portion 13d is disposed defines the second IDT segment 13b.

The bus bar portions 13c and 13d are arranged such as to be positioned at a side that is proximate to the second longitudinally-coupled-resonator SAW filter element 4.

In this preferred embodiment, the propagation direction of surface acoustic waves in the first longitudinally-coupled-resonator SAW filter element 3 and the propagation direction of surface acoustic waves in the second longitudinally-coupled-resonator SAW filter element 4 are substantially parallel to each other.

The second longitudinally-coupled-resonator SAW filter element 4 includes sixth to tenth IDTs 16 to 20 that are arranged in the propagation direction of surface acoustic waves. At the opposite ends of the region in which the IDTs 16 to 20 are arranged in the propagation direction of surface acoustic waves, reflectors 22a and 22b are provided. As mentioned above, first ends of the sixth and tenth IDTs 16 and 20 are electrically connected respectively to the first and fifth IDTs 11 and 15 by first and fourth wiring lines 31 and 34.

On the other hand, first ends of the seventh and ninth IDTs 17, 19 are connected to ground and second ends thereof are electrically connected respectively to a first balanced terminal 6 and a second balanced terminal 7. In other words, the balanced SAW filter 1 achieves a balanced-unbalanced converting function by including the unbalanced terminal 5, and the first and second balanced terminals 6 and 7.

The eighth IDT 18 is similar to the third IDT 13 in that it is divided into two segments arranged in the propagation direction of surface acoustic waves. Specifically, the IDT 18 includes first and second IDT segments 18a and 18b. Similar to the above, one of the bus bars is divided into two portions that define the IDT segments 18a and 18b.

As shown in the drawing, a bus bar portion 18c defining the first IDT segment 18a and a bus bar portion 18d defining the second IDT segment 18b are separated from each other by a gap. The bus bar portions 18c and 18d are disposed at a side of the IDT 18 that is proximate to the first longitudinally-coupled-resonator SAW filter element 3.

In other words, the IDT 13 and the IDT 18 are arranged such that the bus bar portions 13c, 13d and the bus bar portions 18c, 18d are respectively opposed to each other across the space between the first and second longitudinally-coupled-resonator SAW filter elements 3 and 4. The first IDT segment 13a of the third IDT 13 is electrically connected to the first IDT segment 18a of the eighth IDT by a second wiring line 32. Furthermore, the second IDT segment 13b of the third IDT is electrically connected to the second IDT segment 18b of the eighth IDT by a third wiring line 33.

The IDTs 11 to 15 and 16 to 20, the reflectors 21a, 21b, 22a, 22b, and the wiring lines 31 to 34 are made of an appropriate electrode material. In this preferred embodiment, these components are preferably made of Al.

Where the IDTs adjoin each other in this preferred embodiment, the adjoining sides of the IDTs are provided with narrow-pitch electrode-finger sections N. For example, where the IDT 11 and the IDT 12 adjoin each other, a plurality of electrode fingers of the IDT 11 near one side of the IDT 12 have a pitch that is narrower than that of the remaining electrode fingers. The section in which the plurality of electrode fingers have a relatively narrower pitch is referred to as a narrow-pitch electrode-finger section N.

Accordingly, since the IDT 13 includes the IDTs 12 and 14 disposed on opposite sides thereof, the IDT 13 has two narrow-pitch electrode-finger sections N provided adjacent to one side of the IDT 12 and one side of the IDT 14, respectively. Likewise, where the remaining IDTs adjoin each other, the narrow-pitch electrode-finger sections N are provided in the adjoining IDTs.

The narrow-pitch electrode-finger sections N reduce the discontinuity among the IDTs. Furthermore, the longitudinally-coupled-resonator SAW filter elements 3 and 4 have a combination of three resonant modes to attain the desired band property, the three resonant modes including a primary mode, a tertiary mode, and a resonant mode having a resonance point that is dependent on the distance between the IDTs. By providing the narrow-pitch electrode-finger sections N, the distance between the IDTs can be further adjusted, whereby a broadband filter characteristic can be attained. In the present invention, however, the narrow-pitch electrode-finger sections N are not necessarily required.

The impedance in the unbalanced terminal 5 is preferably set to about 50 Ω, and the impedance in the balanced terminals 6 and 7 is preferably set to about 150 Ω.

In preferred embodiments of the present invention, the IDTs 11 to 15 and 16 to 20 are arranged such that the phase of electric signals transmitted through the first and third wiring lines 31 and 33 differs from the phase of signals transmitted through the second and fourth wiring lines 32 and 34 by 180°. Consequently, in the balanced SAW filter 1 having the first and second longitudinally-coupled-resonator SAW filter elements 3 and 4 arranged in two stages that are cascade-connected to each other, unfavorable components resulting from direct waves in the electric signals transmitted to the first and second balanced terminals 6 and 7 are significantly reduced.

Accordingly, when the signals output from the balanced terminals 6 and 7 are to be differentially amplified by, for example, a balanced mixer IC connected as a latter stage, the phase of a synchronizing signal in the signal output from the mixer IC is significantly reduced. This will be described in detail on the basis of an experimental example.

The IDTs 11 to 15 and the reflectors 21a and 21b are arranged on the piezoelectric substrate 2 in the following manner.

Electrode finger cross width: 150 μm

Number of electrode fingers in IDTs 11 to 15: 25(4)/(4)28(4)/(4)42(4)/(4)28(4)/(4)25 in the order IDT 11 to IDT 15. The numerical values in the parentheses indicate the number of electrode fingers in the narrow-pitch electrode-finger sections N, and the numerical values other than those in the parentheses indicate the number of electrode fingers excluding those in the narrow-pitch electrode-finger sections N. For example, 25(4) for the IDT 11 indicates that the IDT 11 has 25 electrode fingers excluding those in the narrow-pitch electrode-finger section thereof and has 4 electrode fingers in the narrow-pitch electrode-finger section. On the other hand, the IDT 12 has 4 electrode fingers in one of its narrow-pitch electrode-finger sections N, 28 electrode fingers in the middle, and 4 electrode fingers in the other narrow-pitch electrode-finger section.

Number of electrode fingers in reflectors: 80

Metallization ratio: 0.70

Electrode film thickness: 0.082λI (where λI represents a wavelength determined from the pitch of electrode fingers excluding those in the narrow-pitch electrode-finger sections N)

The specifications of the IDTs 16 to 20 and the reflectors 22a and 22b in the second longitudinally-coupled-resonator SAW filter element 4 are preferably the same as those of the IDTs 11 to 15 and the reflectors 21a and 21b in the first longitudinally-coupled-resonator SAW filter element 3.

As shown in FIG. 1, the IDTs 11 to 13 and 15 are symmetrical to the IDTs 16 to 18 and 20 of the second longitudinally-coupled-resonator SAW filter element 4 with respect to an imaginary center line which extends through the center between the longitudinally-coupled-resonator SAW filter elements 3 and 4 and parallel to the propagation direction of surface acoustic waves. The fourth IDT 14 and the ninth IDT 19, however, are not symmetrical to each other with respect to the imaginary center line.

Figure 2:
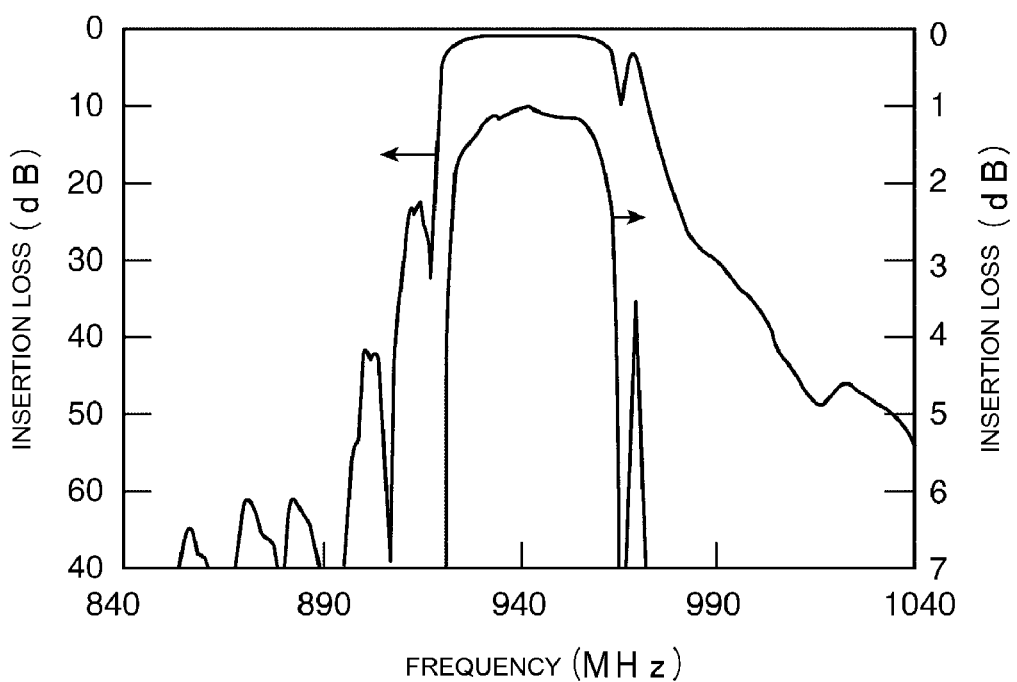
FIG. 2 illustrates attenuation-versus-frequency characteristics of the balanced SAW filter shown in FIG. 1.
Figure 3:
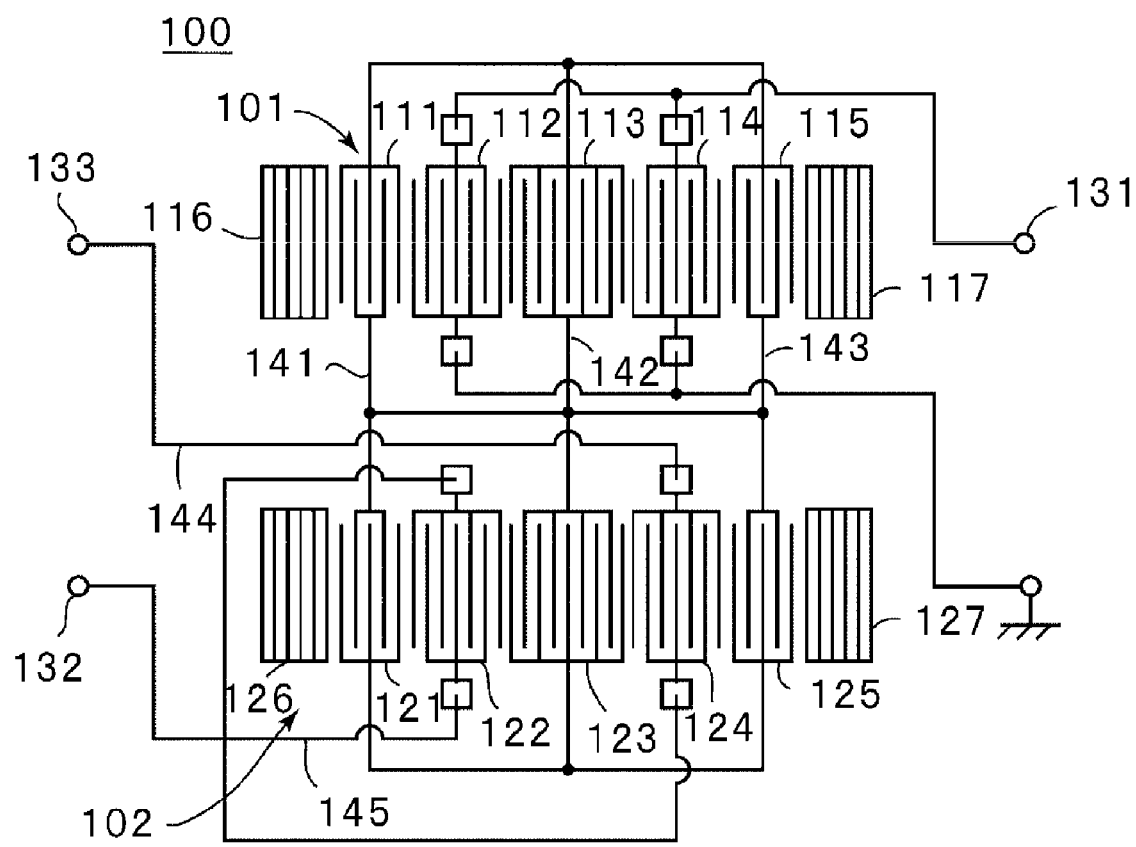
FIG. 3 is a schematic plan view showing a conventional example of a balanced SAW filter.

FIG. 2 shows attenuation-versus-frequency characteristics of the balanced SAW filter 1 according to this preferred embodiment. As shown in FIG. 2, the maximum insertion loss within the pass band is maintained at a low value of about 1.66 dB.

The longitudinally-coupled-resonator SAW filter elements in this preferred embodiment reduce the insertion loss within the pass band as mentioned above.

In addition, for example, in FIG. 1, the polarities of the adjoining outermost electrode fingers of the IDT 16 and the IDT 17 are negative and positive, the polarities of the adjoining outermost electrode fingers of the IDT 17 and the IDT 18 are negative and negative, the polarities of the adjoining outermost electrode fingers of the IDT 18 and the IDT 19 are negative and negative, and the polarities of the adjoining outermost electrode fingers of the IDT 19 and the IDT 20 are positive and negative.

Therefore, the polar relationship among the adjoining outermost electrode fingers of the IDTs 16 and 18 connected to the first balanced terminal 6 and the IDT 17 adjoining the IDTs 16 and 18 is the same as the polar relationship among the adjoining outermost electrode fingers of the IDTs 18 and 20 connected to the second balanced terminal 7 and the IDT 19 adjoining the IDTs 18 and 20. Accordingly, this achieves a high degree of balance between the first and second balanced terminals 6 and 7.

In the above preferred embodiment, although the end of the third IDT 13 that is not connected to the second longitudinally-coupled-resonator SAW filter element and the end of the eighth IDT 18 that is not connected to the first longitudinally-coupled-resonator SAW filter element are preferably grounded, these ends may alternatively be electrically floating. When these ends are electrically floating, it is not necessary to provide grounding pads at the ends of the third and eighth IDTs. Accordingly, the size of the piezoelectric substrate can be reduced.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced SAW filter having an unbalanced terminal and first and second balanced terminals, the balanced SAW filter comprising:
    a piezoelectric substrate;
    a first longitudinally-coupled-resonator SAW filter element including first to fifth IDTs arranged on the piezoelectric substrate in a propagation direction of surface acoustic waves, the second and fourth IDTs being connected to the unbalanced terminal, the third IDT in the center having a pair of bus bars, one of the bus bars being divided such that the third IDT includes first and second IDT segments;
    a second longitudinally-coupled-resonator SAW filter element including sixth to tenth IDTs arranged on the piezoelectric substrate in the propagation direction of surface acoustic waves, the seventh and ninth IDTs being respectively connected to the first and second balanced terminals, the eighth IDT in the center having a pair of bus bars, one of the bus bars being divided such that the eighth IDT is comprised of first and second IDT segments;
    a first wiring line connecting the first IDT to the sixth IDT;
    a second wiring line connecting the first IDT segment of the third IDT to the first IDT segment of the eighth IDT;
    a third wiring line connecting the second IDT segment of the third IDT to the second IDT segment of the eighth IDT; and
    a fourth wiring line connecting the fifth IDT to the tenth IDT; wherein
    the first to tenth IDTs are arranged such that the phase of electric signals transmitted through the first and third wiring lines differs from the phase of electric signals transmitted through the second and fourth wiring lines by 180°.

2. The balanced SAW filter according to claim 1, wherein the third IDT in the first longitudinally-coupled-resonator SAW filter element includes an end that is not connected to the second longitudinally-coupled-resonator SAW filter element, and the eighth IDT in the second longitudinally-coupled-resonator SAW filter element includes an end that is not connected to the first longitudinally-coupled-resonator SAW filter element, said end of the third IDT and said end of the eighth IDT being grounded.

3. The balanced SAW filter according to claim 1, wherein the third IDT in the first longitudinally-coupled-resonator SAW filter element includes an end that is not connected to the second longitudinally-coupled-resonator SAW filter element, and the eighth IDT in the second longitudinally-coupled-resonator SAW filter element includes an end that is not connected to the first longitudinally-coupled-resonator SAW filter element, said end of the third IDT and said end of the eighth IDT being electrically floating.

4. The balanced SAW filter according to claim 1, wherein the piezoelectric substrate is a 40±5° Y-cut X-propagation $LiTaO_3$ substrate.

5. The balanced SAW filter according to claim 1, wherein each of the first and second longitudinally-coupled-resonator SAW filter elements includes a pair of reflectors arranged at opposite ends in the propagation direction of surface acoustic waves of the first to fifth IDTs and the sixth to tenth IDTs, respectively.

6. The balanced SAW filter according to claim 1, wherein adjoining sides of the first to fifth IDTs are provided with narrow-pitch electrode-finger sections.

7. The balanced SAW filter according to claim 1, wherein adjoining sides of the sixth to tenth IDTs are provided with narrow-pitch electrode-finger sections.

* * * * *